US012136582B2

(12) United States Patent
Yokoyama et al.

(10) Patent No.: US 12,136,582 B2
(45) Date of Patent: Nov. 5, 2024

(54) POWER MODULE AND POWER CONVERSION DEVICE

(71) Applicant: Mitsubishi Electric Corporation, Tokyo (JP)

(72) Inventors: Yoshinori Yokoyama, Tokyo (JP); Tetsu Negishi, Tokyo (JP); Koji Yamazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 230 days.

(21) Appl. No.: 17/780,519

(22) PCT Filed: Dec. 26, 2019

(86) PCT No.: PCT/JP2019/051238
§ 371 (c)(1),
(2) Date: May 27, 2022

(87) PCT Pub. No.: WO2021/130989
PCT Pub. Date: Jul. 1, 2021

(65) Prior Publication Data
US 2022/0415747 A1    Dec. 29, 2022

(51) Int. Cl.
*H01L 23/48*    (2006.01)
*H01L 23/053*   (2006.01)
(Continued)

(52) U.S. Cl.
CPC ........ *H01L 23/3675* (2013.01); *H01L 23/053* (2013.01); *H05K 3/321* (2013.01)

(58) Field of Classification Search
CPC ... H01L 23/367; H01L 24/32; H01L 23/3675; H01L 23/053; H05K 3/321
See application file for complete search history.

(56) References Cited

U.S. PATENT DOCUMENTS

2012/0306087 A1    12/2012  Bayerer et al.
2015/0115452 A1*   4/2015   Yoon .................. H01L 24/29
                                                           228/256
(Continued)

FOREIGN PATENT DOCUMENTS

CN    102265393 A    11/2011
JP    2012-513682 A   6/2012
(Continued)

OTHER PUBLICATIONS

International Search Report and Written Opinion mailed on Mar. 17, 2020, received for PCT Application PCT/JP2019/051238, Filed on Dec. 26, 2019, 11 pages including English Translation.
(Continued)

*Primary Examiner* — Hoa B Trinh
(74) *Attorney, Agent, or Firm* — XSENSUS LLP

(57) ABSTRACT

A power module is obtained in which the thermal resistance in the range from a semiconductor device to a base plate is reduced and the stress in the joining portion is relieved. The power module includes at least one semiconductor device, an insulating substrate having an insulating layer, a circuit layer provided on an upper surface of the insulating layer and a metal layer provided on a lower surface of the insulating layer, and a sintering joining member with an upper surface larger in outer circumference than a back surface of the at least one semiconductor device, to join together the back surface of the at least one semiconductor device and an upper surface of the circuit layer on an upper-surface side of the insulating layer.

21 Claims, 12 Drawing Sheets

(51) Int. Cl.
*H01L 23/367* (2006.01)
*H05K 3/32* (2006.01)

(56) References Cited

U.S. PATENT DOCUMENTS

2019/0172810 A1* 6/2019 Kumakawa ............. H01L 24/32
2020/0251423 A1   8/2020 Yabuta et al.

FOREIGN PATENT DOCUMENTS

| JP | 2014-120717 A | 6/2014 | |
|----|---|---|---|
| JP | 2018-129352 A | 8/2018 | |
| JP | 2019-33131 A | 2/2019 | |
| JP | 2019-175989 A | 10/2019 | |
| WO | 2013/141149 A1 | 9/2013 | |
| WO | WO-2016121159 A1 * | 8/2016 | ......... H01L 21/4882 |
| WO | 2019/087920 A1 | 5/2019 | |

OTHER PUBLICATIONS

Notice of Reasons for Refusal mailed on Nov. 10, 2020, received for JP Application 2020-544056, 11 pages including English Translation.

Chinese Office Action issued May 12, 2024, in corresponding Chinese Patent Application No. 201980103160.X, 20pp.

* cited by examiner

POWER MODULE AND POWER CONVERSION DEVICE

CROSS-REFERENCE TO RELATED APPLICATION

The present application is based on PCT filing PCT/JP2019/051238, filed Dec. 26, 2019, the entire contents of which is incorporated herein by reference.

TECHNICAL FIELD

This disclosure relates to a power module and a power conversion device having reduced thermal resistance.

BACKGROUND TECHNOLOGY

In a power module, when a semiconductor device mounted on the power module is operated, the semiconductor device generates heat. The heat from the semiconductor device generates thermal stress between components of the power module, and as a result, causes deterioration of the reliability of the power module. Therefore, a power module is required to have high heat dissipation in order to suppress the temperature rise due to the heat generation of the semiconductor device.

To cope with this, with the intention of reducing the influence of the heat generated from the semiconductor device, a metal plate that is larger than the semiconductor device is used to spread the heat of the semiconductor device in the lateral direction in order to improve the heat dissipation from the semiconductor device and reduce the thermal resistance therearound (for example, Patent Document 1).

PRIOR ART LITERATURE

Patent Documents

[Patent Document 1] Japanese Unexamined Patent Application Publication No. 2014-120717

SUMMARY OF THE INVENTION

Problems to be Solved by the Invention

Although, in the power module described in Patent Document 1, the heat is spread out in the lateral direction by joining the semiconductor device to the metal plate, which is larger than the semiconductor device, using a joining material, the solder used as the joining material and the size of the solder area that is almost of the same size as the semiconductor device still contribute to keep the thermal resistance high and the effect of spreading the heat insufficient, in the thermal path from the semiconductor device to the metal plate. As a result, the reliability of the power module deteriorates.

This disclosure is created to solve the above-mentioned problems and to obtain a power module having improved reliability by spreading heat from a semiconductor device and thus improving the heat dissipation from the semiconductor device.

Means for Solving the Problems

The power module according to this disclosure includes at least one semiconductor device, an insulating substrate having an insulating layer, a circuit layer provided on an upper surface of the insulating layer, and a metal layer provided on a lower surface of the insulating layer, a sintering joining member with an upper surface larger in outer circumference than a back surface of the at least one semiconductor device to join together the back surface of the at least one semiconductor device and an upper surface of the circuit layer on an upper-surface side of the insulating layer, a base plate joined to the lower surface of the insulating substrate, and a wiring member joined to a front surface of the at least one semiconductor device, wherein the elastic moduli of members are increased in the following order: the at least one semiconductor device, a structure in which the base plate and the insulating substrate are joined together, the wiring member, and the sintering joining member.

Advantageous Effects of the Invention

In this disclosure, a sintering joining member that is larger in outer circumference than the back surface of a semiconductor device is provided. This makes it possible to improve the heat dissipation from the semiconductor device, which in turn improves the reliability of the power module.

DESCRIPTION OF EMBODIMENTS

First, an overall configuration of a power module according to this disclosure will be described with reference to the drawings. Note that the figures are schematic and do not reflect the exact sizes of the components shown in the figures. In addition, the components with the same reference numerals are the same or equivalent components, which is common in the entire specification.

Embodiment 1

Figure 1:
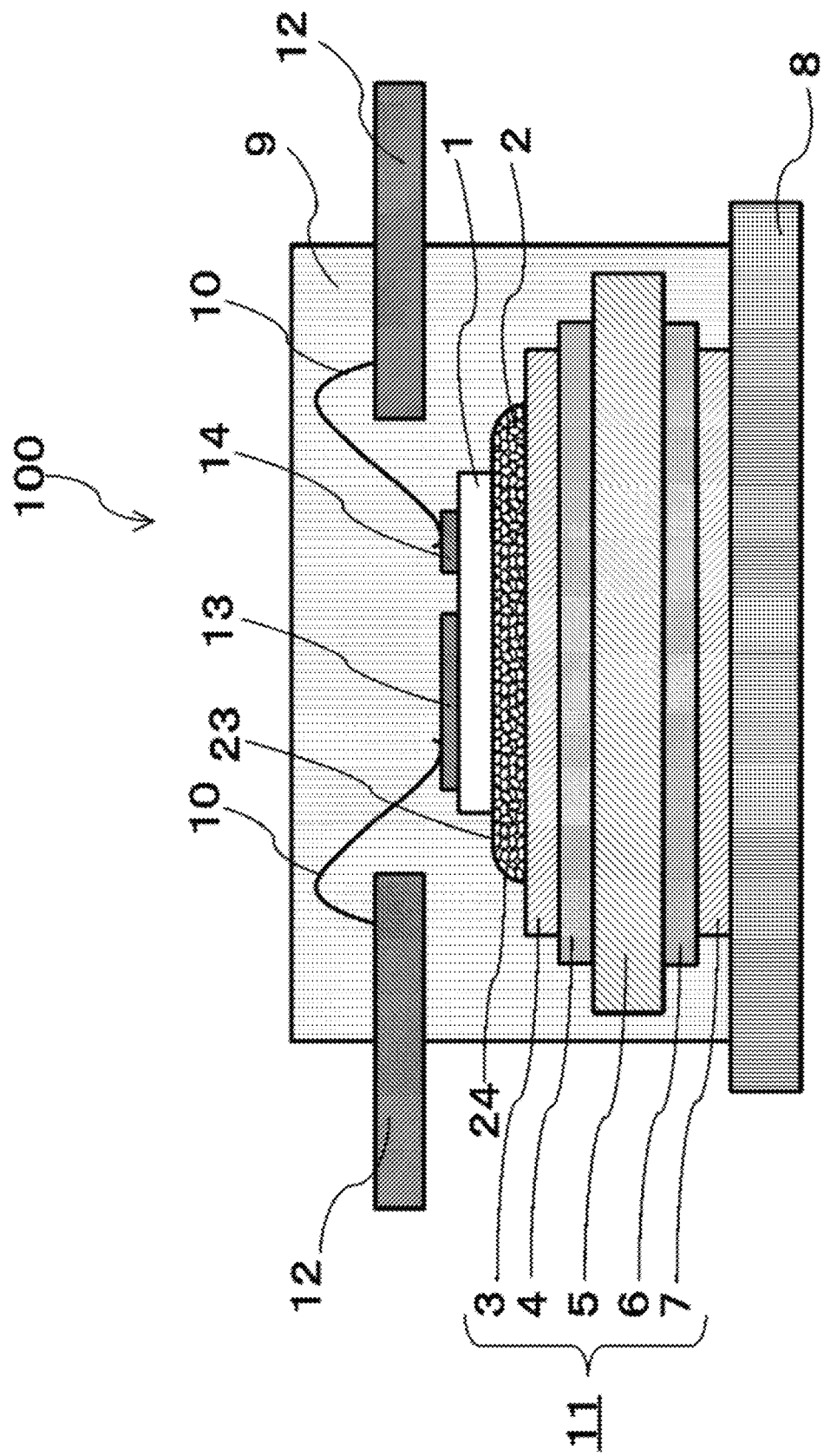
FIG. 1 is a schematic diagram of a cross-sectional structure showing a power module according to Embodiment 1.

FIG. 1 is a schematic diagram of a cross-sectional structure showing a power module according to Embodiment 1.

Figure 2:
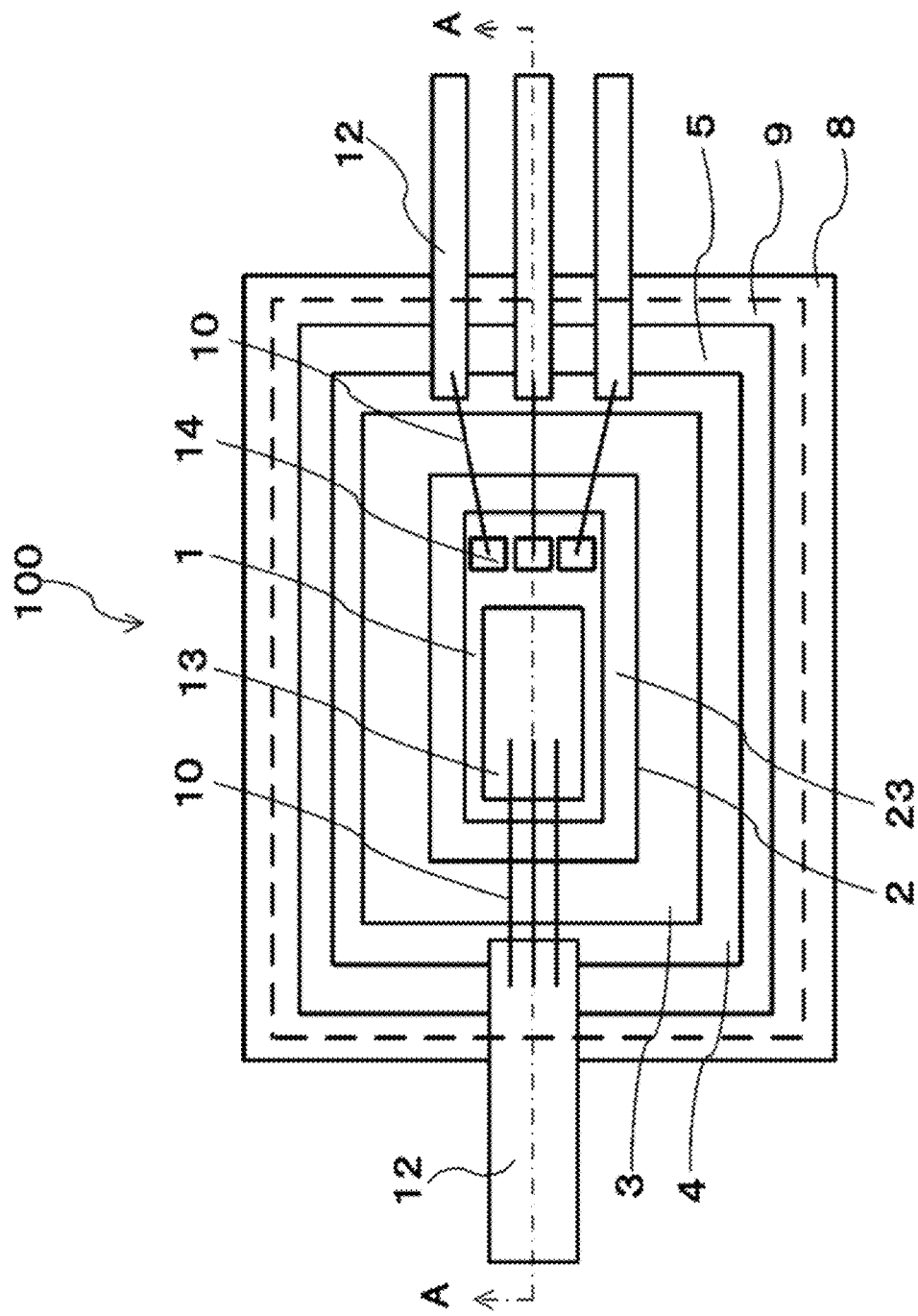
FIG. 2 is a schematic diagram of a planar structure showing the power module according to Embodiment 1.

FIG. 2 is a schematic diagram of a planar structure showing the power module according to Embodiment 1. FIG. 1 is a schematic diagram of a cross-sectional structure along the single-dotted line AA in FIG. 2. FIG. 2 is a schematic diagram of a planar structure of the power module 100 viewed from above through a sealing member 9.

As shown in these figures, the power module 100 includes a semiconductor device 1, a sintering joining member 2, an insulating substrate 11, a base plate 8, a sealing member 9, bonding wires 10, which are wiring members, and lead terminals 12.

In FIG. 1, in the power module 100, the insulating substrate 11 is directly joined to the upper surface of the base plate 8. The semiconductor device 1 is joined to the upper surface of the insulating substrate 11 via the sintering joining member 2, which has the upper surface larger in outer circumference than the back surface of the semiconductor device 1. A main electrode 13 and control signal electrodes 14 are formed on the upper surface of the semiconductor device 1. The main electrode 13 and the control signal electrodes 14 of the semiconductor device 1 are each connected to a lead terminal 12 via a bonding wire 10. The sealing member 9 is in contact with the upper surface of the base plate 8 so as to seal the insulating substrate 11, the semiconductor device 1 and the bonding wires 10. One end of each lead terminal 12 is arranged inside the sealing member 9, and the other end protrudes from the side surface of the sealing member 9.

In FIG. 2, the sealing member 9 is shown by the broken line, so that the positional relationship with the members sealed in the sealing member 9 can be understood. The outermost circumference of the power module 100 is the periphery of the base plate 8. The sealing member 9 is arranged inside the periphery of the base plate 8. An insulating layer 5 of the insulating substrate 11 is positioned inside the outer edge of the sealing member 9. A second circuit layer 4 of the upper-surface side of the insulating substrate 11 is positioned inside the outer edge of the insulating layer 5 of the insulating substrate 11. A first circuit layer 3 is positioned inside the outer edge of the second circuit layer 4. The sintering joining member 2 is positioned inside the outer edge of the first circuit layer 3. The semiconductor device 1 is joined to the upper surface of the sintering joining member 2, which is larger in outer circumference than the back surface of the semiconductor device 1. It is desirable that the outer circumference of the sintering joining member 2 is larger at every point thereof than the outer circumference of the semiconductor device 1. However, there may be a section in which the outer circumference of the sintering joining member 2 overlaps with or smaller than the outer circumference of the semiconductor device 1.

The power module 100 includes the plurality of lead terminals 12, which are provided on either of a pair of opposing sides in the power module 100. In each of the lead terminals 12, one end thereof is positioned inside the outer edge of the sealing member 9, and the other end thereof is positioned outside the outer edge of the sealing member 9. The lead terminals 12 are each joined to the main electrode 13 or one of the control signal electrodes 14, which are formed on the upper surface of the semiconductor device 1, via one or more bonding wires 10.

Next, a structure, materials, and properties of the materials of each component will be described.

The semiconductor device 1 has a front surface (upper surface) and a back surface (lower surface). The main electrode 13 and the control signal electrodes 14, which are front-surface electrodes, are formed on the front surface of the semiconductor device 1, and a back-surface electrode (not shown), which is of the same size as the outer circumference of the back surface of the semiconductor device 1, is formed on the back surface of the semiconductor device 1. The main electrode 13 and each of the control signal electrodes 14 of the semiconductor device 1 are each connected to a lead terminal 12, which is a terminal member, via a bonding wire 10, which is a wiring member. Examples of the semiconductor device 1 includes an Insulated Gate Bipolar Transistor (IGBT), a Free Wheel Diode (FWD), and a Metal Oxide Semiconductor Field Effect Transistor (MOSFET).

Examples of the material of the semiconductor device 1 include Silicon (Si), Silicon Carbide (SiC), Gallium Nitride (GaN), and Gallium (III) Oxide ($Ga_2O_3$). However, the types and materials of the semiconductor device 1 are not limited to these. The power module 100 shown in FIG. 1 includes one semiconductor device 1, but may include a plurality of semiconductor devices 1. Even when the plurality of semiconductor devices 1 are included, the semiconductor devices 1 and the first circuit layer 3 may be joined using the sintering joining member 2.

As shown in FIGS. 1 and 2, the main electrode 13 and the control signal electrodes 14 are provided on the surface of the semiconductor device 1. However, the types of electrodes formed on the surface of the semiconductor device 1 are not limited to these. For example, only the main electrode 13 may be formed on the surface of the semiconductor device 1.

The insulating substrate 11 has an upper surface and a lower surface. The insulating substrate 11 has the insulating layer 5. For the insulating layer 5, a ceramic substrate made of material such as Aluminum Oxide ($Al_2O_3$), Aluminum Nitride (AlN), and Silicon Nitride ($Si_3N_4$) is used. However, the materials of the ceramic substrate are not limited to these.

The insulating layer 5 has an upper surface and a lower surface. On the upper surface side of the insulating layer 5, the first circuit layer 3 and the second circuit layer 4, which are circuit layers, are formed. The lower surface of the second circuit layer 4 is in contact with the upper surface of the insulating layer 5. The lower surface of the first circuit layer 3 is in contact with the upper surface of the second circuit layer 4. On the lower-surface side of the insulating layer 5, a first metal layer 7 and a second metal layer 6, which are metal layers, are formed. The upper surface of the second metal layer 6 is in contact with the lower surface of the insulating layer 5. The upper surface of the first metal layer 7 is in contact with the lower surface of the second metal layer 6. Copper (Cu), for example, is used for the first circuit layer 3 and the first metal layer 7, and aluminum (Al), for example, is used for the second circuit layer 4 and the second metal layer 6. However, the materials to be used for the first circuit layer 3, the first metal layer 7, the second circuit layer 4, and the second metal layer 6 are not limited to these.

It suffices if the second circuit layer 4 and the second metal layer 6 can be joined to the ceramic substrate, which is the insulating layer 5, using a direct joining method or an active metal joining method. Also, it suffices if the first circuit layer 3 and the first metal layer 7 can be joined to the ceramic substrate 5 via the second circuit layer 4 and the second metal layer 6, respectively, using the direct joining method or the active metal joining method. It suffices if the materials to be used for the first circuit layer 3, the first metal layer 7, the second circuit layer 4, and the second metal layer 6 are a material with high electrical conductivity. The second circuit layer 4 and the second metal layer 6 are used as a buffer layer to relieve the stress generated between layers when the first circuit layer 3 and the first metal layer 7 are joined to the ceramic substrate having a linear expansion coefficient different from those of the first circuit layer 3 and the first metal layer 7. Here, the direct joining method is a method of joining the second circuit layer 4 and the second metal layer 6 to the ceramic substrate by causing the second circuit layer 4 and the second metal layer 6 to react directly with the ceramic substrate. The active metal joining method is a method of joining the second circuit layer 4 or the second metal layer 6 to the ceramic substrate by using a brazing material to which an active metal such as titanium (Ti) and zirconium (Zr) is added.

In the insulating substrate 11, if the outer peripheral edges of the first circuit layer 3 and the second circuit layer 4 or the first metal layer 7 and the second metal layer 6 are aligned by making them substantially equal in lateral size, there is a concern that stress is concentrated on the outer peripheral edge of the first circuit layer 3 or the first metal layer 7, and, as a result, a crack occurs in the second circuit layer 4 or the second metal layer 6, which is serving as a buffer layer, and the crack extends to the ceramic substrate. Therefore, in order to prevent the crack from extending, the sizes of the first circuit layer 3 and the first metal layer 7 in the lateral direction are made smaller than the sizes of the second circuit layer 4 and the second metal layer 6 in the lateral direction, respectively.

The sintering joining member 2 has an upper surface and a lower surface. The sintering joining member 2 is provided between the semiconductor device 1 and the first circuit layer 3. The sintering joining member 2 joins the back-surface electrode of the semiconductor device 1 and the upper surface of the first circuit layer 3 together. The outer circumference of the sintering joining member 2 is larger than the outer circumference of the back surface of the semiconductor device 1 in size, and thus it has a flat portion 23, which protrudes outward (be exposed) from the outer circumference of the back surface of the semiconductor device 1. The sintering joining member 2 is a metal conductor containing metal particles of silver or copper. The raw materials of the sintering joining member 2 include, for example, a sinter paste material such as an Ag nanoparticle paste, a Cu nanoparticle paste, and the same pastes whose particles include microparticles. The particles form voids inside the sintering joining member 2. A soft sintering joining member 2, whose elastic modulus is 13 GPa or lower, can be formed by setting the porosity, defined as the ratio of the volume of the voids to the total volume of the sintering joining member 2, to at least 30% and no more than 50%. The thermal resistance of the sintering joining member 2 is lower than any of the thermal resistances of the insulating layer 5, the first circuit layer 3 and the second circuit layer 4 both provided on the upper-surface side of the insulating layer 5, and the first metal layer 7 and the second metal layer 6 both provided on the lower-surface side of the insulating layer 5.

The configuration shown in FIGS. 1 and 2 includes one semiconductor device 1, one sintering joining member 2, and one first circuit layer 3. However, the plurality of semiconductor devices 1 and the same number of the sintering joining members 2 may be provided and placed each on the upper surface of the first circuit layer 3.

The base plate 8, which is plate-shaped, has an upper surface and a lower surface. The base plate 8 serves as a heat dissipator that dissipates heat generated during the operation of the power module 100 to the outside of the power module 100. Therefore, a material with good thermal conductivity is used for the base plate 8. As the material of the base plate 8, for example, an alloy whose main component is either aluminum (Al) or copper (Cu), a composite material (Al—SiC) of silicon carbide (SiC) and Al, or a composite material (Mg—SiC) of SiC and magnesium (Mg) may be used. However, the materials that can be used for the base plate 8 are not limited to these.

The insulating substrate 11 is directly joined to the upper surface of the base plate 8. Specifically, the first metal layer 7 provided on the lower-surface side of the insulating substrate 11 is directly joined to the upper surface of the base plate 8. The direct joining method or the active metal joining method is used as a method for joining the first metal layer 7 provided on the lower-surface side of the insulating substrate 11 to the upper surface of the base plate 8.

The sealing member 9 is a resin that seals the members on the upper-surface side of the base plate 8 including the insulating substrate 11 joined to the upper surface of the base plate 8 and the semiconductor device 1 joined to the upper surface of the insulating substrate 11 using the sintering joining member 2 in such a way that the resin itself is in contact with the upper surface of the base plate 8. The configuration of the power module 100 shown in FIG. 1 can serve as one unit. In that case, the plurality of units may be used in combination. Therefore, instead of sealing the units individually, the inside of the body of the power module with the plurality of units mounted therein may be sealed in a single sealing process (integrated sealing) using the sealing member 9. As the material of the sealing member 9, for example, an epoxy resin is used. However, the materials to be used for the sealing member 9 are not limited to this. For example, silicone resin, urethane resin, polyimide resin, polyamide resin, polyamide-imide resin, acrylic resin, rubber material or the like can be used.

The lead terminals 12 are a terminal member for electrically connecting the inside of the power module 100, which is covered with the sealing member 9, and the outside. The lead terminals 12 are connected to the front-surface electrodes of the semiconductor device 1 via the bonding wires 10. The materials for the lead terminals 12 are good electrical conductors such as aluminum, copper, silver, gold, an alloy of these, and a composite material. However, they are not limited to these, and any material to which a bonding wire 10 can be bonded may be used.

The bonding wires 10 electrically connect the electrodes formed on the front surface of the semiconductor device 1 to the lead terminals 12. The bonding wires 10 are bonded to the front surface side of the semiconductor device 1. The bonding wires 10 can also be used as a wiring means for connecting the circuit layers provided on the upper-surface side of the insulating substrate 11 together. In FIG. 2, as for the number of the bonding wires 10, one bonding wire 10 is shown for each of the control signal electrodes 14 and three bonding wires 10 are shown for the main electrode 13. However, the configuration is not limited to this, and the wiring may be provided using a larger number of the bonding wires 10 or using the bonding wires 10 with different thickness, depending on the needs in the circuit configuration of the power module 100. Examples of the materials to be used for the bonding wires 10 include, but is not limited to, good electrical conductors that can be bonded to the main electrode 13, the control signal electrodes 14, and the lead terminals 12, such as aluminum, copper, silver, gold, an alloy of these, and a composite material.

Figure 3:
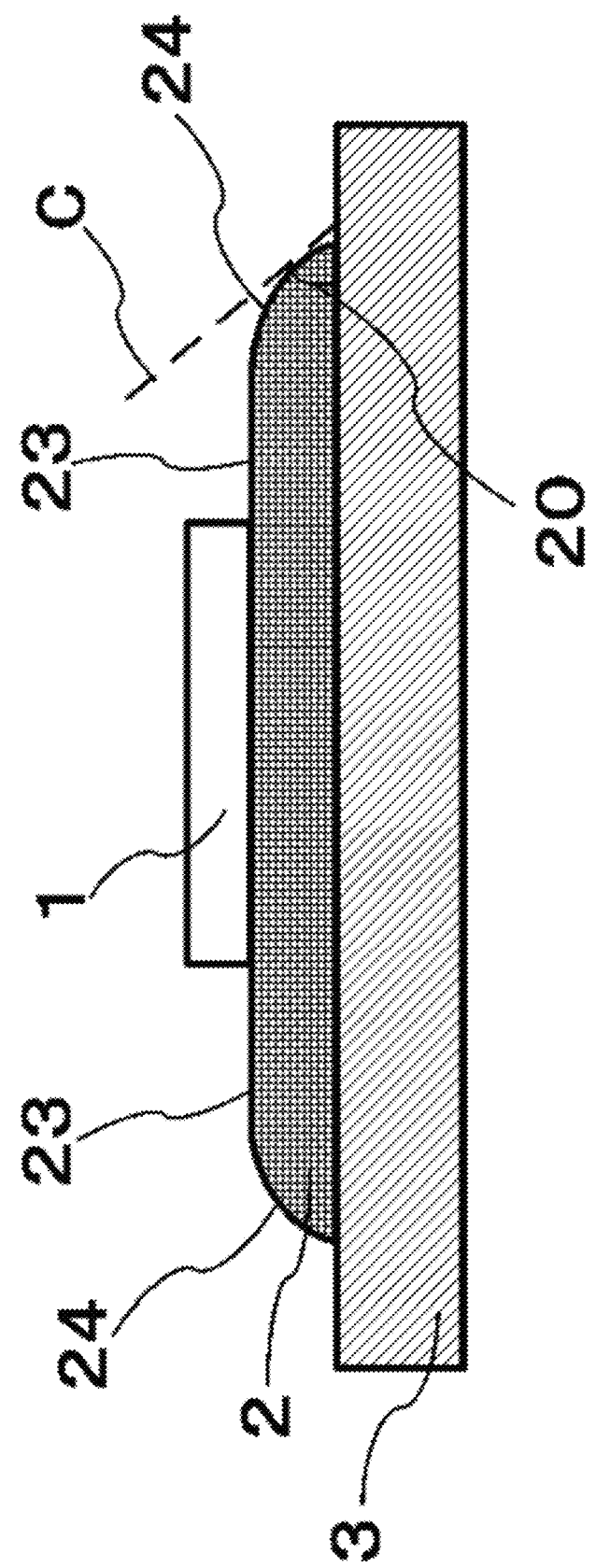
FIG. 3 is a schematic diagram of a cross-sectional structure, in which a semiconductor device joining portion of the power module according to Embodiment 1 is enlarged.
Figure 4:
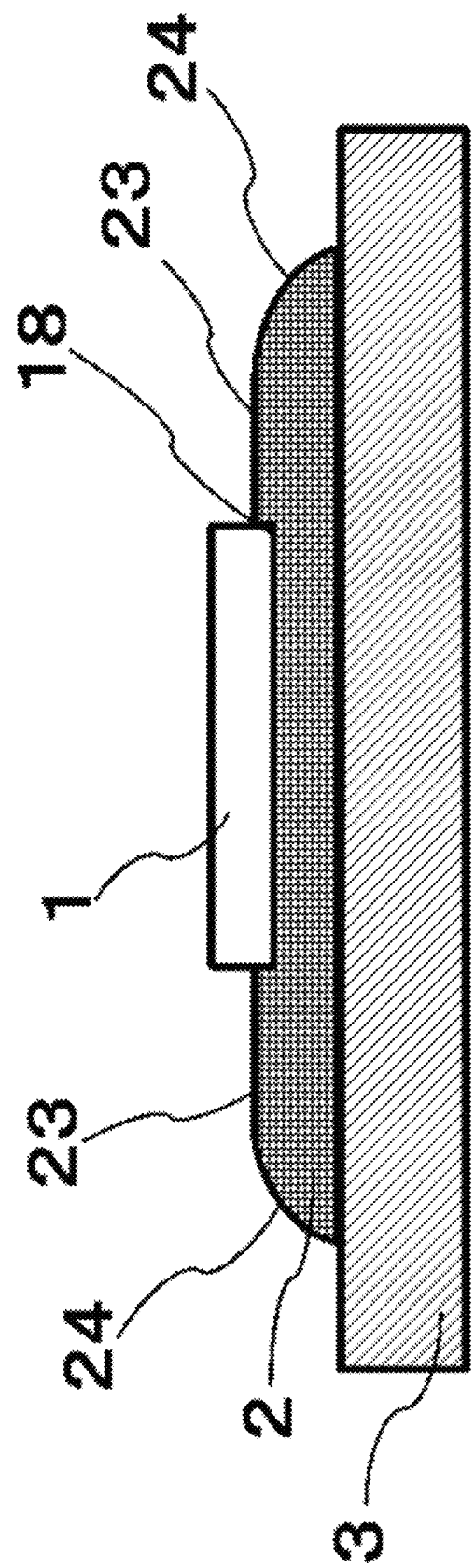
FIG. 4 is another schematic diagram of a cross-sectional structure, in which the semiconductor device joining portion of the power module according to Embodiment 1 is enlarged.
Figure 5:
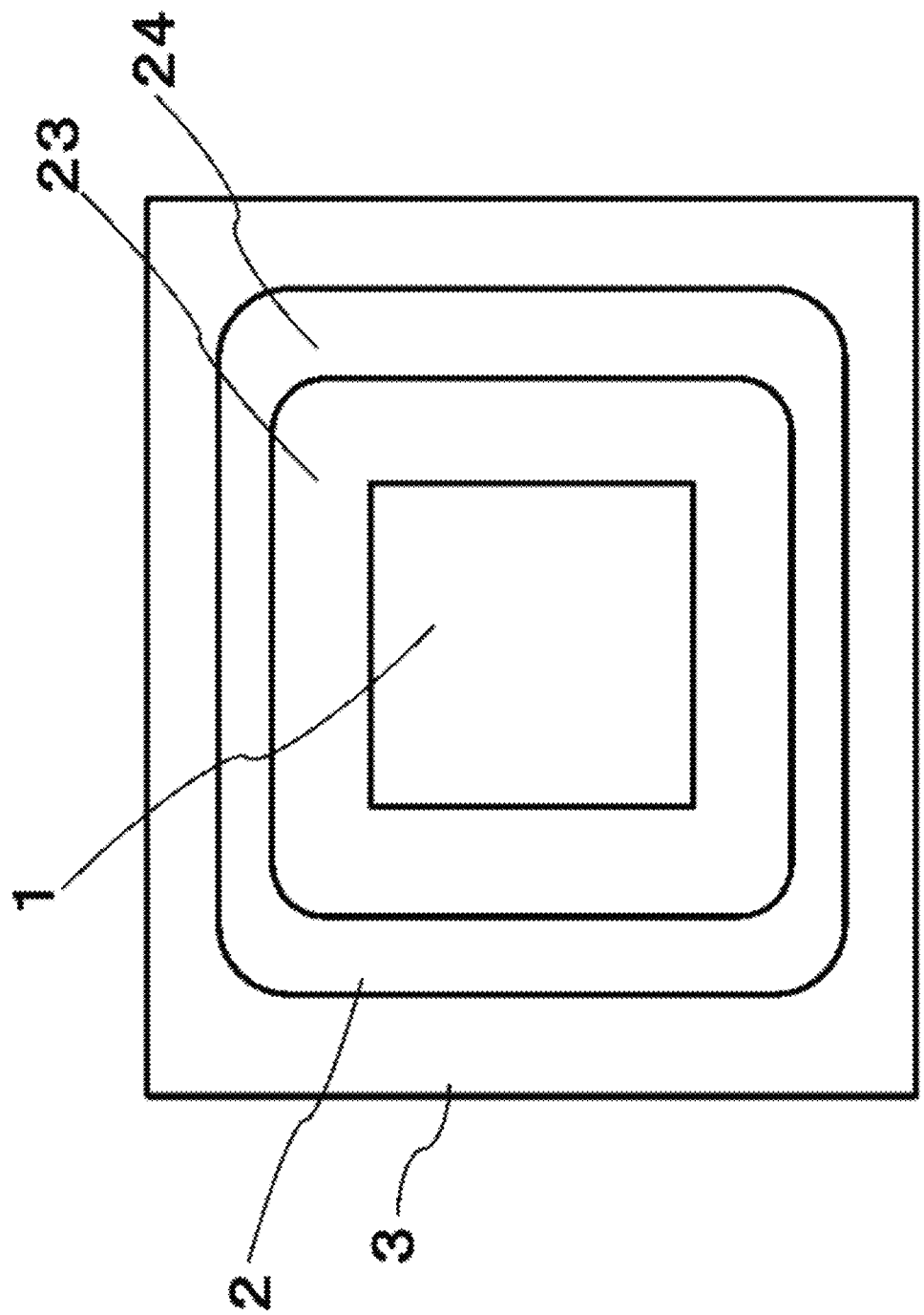
FIG. 5 is a schematic diagram of a planar structure, in which the semiconductor device joining portion of the power module according to Embodiment 1 is enlarged.

FIG. 3 is a schematic diagram of a cross-sectional structure, in which a semiconductor device joining portion of the power module according to Embodiment 1 is enlarged. FIG. 4 is another schematic diagram of a cross-sectional structure, in which the semiconductor device joining portion of the power module according to Embodiment 1 is enlarged. FIG. 5 is a schematic diagram of a planar structure, in which the semiconductor device joining portion of the power module according to Embodiment 1 is enlarged.

As shown in FIG. 3, the sintering joining member 2 has the flat portion 23 and a side portion 24. The sintering joining member 2 is larger than the back surface of the semiconductor device 1 in outer circumference, so that the flat portion 23 sticks out of the outer circumference of the back surface of the semiconductor device 1. The side portion 24 of the sintering joining member 2 has a shape in which the distance between the upper surface and the lower surface of the sintering joining member 2 increases from the outside to the inside of the sintering joining member 2. The sintering joining member 2 contracts by the sintering treatment. As a result, in the side portion 24 of the sintering joining member 2, a taper is created between the upper surface and the lower surface. The angle of the taper is represented as an angle between the straight line shown by the dotted line C and the lower surface of the sintering joining member 2 (the upper surface of the first circuit layer 3), namely, a slope (taper) angle 20. The shape of the taper slope of the side portion 24 in the sintering joining member 2 can be straight or curved. Note that, depending on the slope angle 20 of the sintering joining member 2, around the outer peripheral edge of the semiconductor device 1, the side portion 24 of the sintering joining member 2 may be formed as a sloped side from the upper surface to the lower surface of the semiconductor device 1 without clearly having the flat portion 23.

To be specific, in the side portion 24 of the sintering joining member 2, the taper angle 20 is formed in the manufacturing process because the portion of the upper-surface side of the sintering joining member 2 where it is not joined to the semiconductor device 1 is more likely to contract than the lower-surface side of the sintering joining member 2, which is joined to the first circuit layer 3. The taper angle 20 at the edge of the side portion 24 of the sintering joining member 2 is 45 to 90 degrees and at least the corner formed along the circumference of the sintering joining member 2 has a rounded shape. The taper angle 20 below 45 degrees increases the difference in contraction between the upper surface and the lower surface of the sintering joining member 2 and, as a result, may peel off the sintering joining member 2 at the joining portion between the lower surface of the sintering joining member 2 and the upper surface of the first circuit layer 3. For this reason, it is desirable for the taper angle 20 to be at least 45 degrees for ensuring the reliability at the joining portion. The width (length) of the flat portion 23 of the sintering joining member 2, which ranges from 1 to 2 mm, may be determined according to the rating (voltage) to be applied to the power module.

The sintering joining member 2 shown in FIG. 4 has a recess (depression) 18 in its upper surface. Its basic configuration is the same as that shown in FIG. 3. In the configuration shown in FIG. 4, however, the recess 18 is provided in the area of the sintering joining member 2 where the sintering joining member 2 is in contact with the back surface of the semiconductor device 1. The back surface of the semiconductor device 1 is joined to the sintering joining member 2 in the recess 18. The back-surface electrode of the semiconductor device 1 is joined to the bottom and side surfaces of the recess 18 provided in the upper surface of the sintering joining member 2. The sintering joining member 2 is pressurized after the semiconductor device 1 is placed on its upper surface. As a result, the recess 18 is formed on the upper surface of the sintering joining member 2 by the semiconductor device 1 being suppressed to the upper surface of the sintering joining member 2.

FIG. 5 is a schematic diagram of a planar (upper surfaces) structure of the configurations shown in FIGS. 3 and 4. In FIG. 5, since it is seen from above (planer view), the peripheries of both the recess 18 shown in FIG. 4 and the semiconductor device 1 overlap with each other. As shown in FIG. 5, on the outside of the periphery of the semiconductor device 1, the flat portion 23 of the sintering joining member 2 and the side portion 24 of the sintering joining member 2, which is continued from the flat portion 23, are arranged.

The sintering joining member 2 shown in FIG. 3, FIG. 4, and FIG. 5 can join members under no pressure or under a pressure of 5 MPa or less, as a solder normally used as joining material can join members. It is depending on the magnitude of the pressure whether the upper surface of the sintering joining member 2 has the recess 18 as shown in FIG. 4 or is flattened as shown in FIG. 3. As for the thickness of the sintering joining member 2, the thickness after sintering is about 40 µm. For the sake of simplicity, FIGS. 3, 4, and 5 do not show the metal particles and the voids that make up the sintering joining member 2 shown in FIG. 1.

Figure 6:
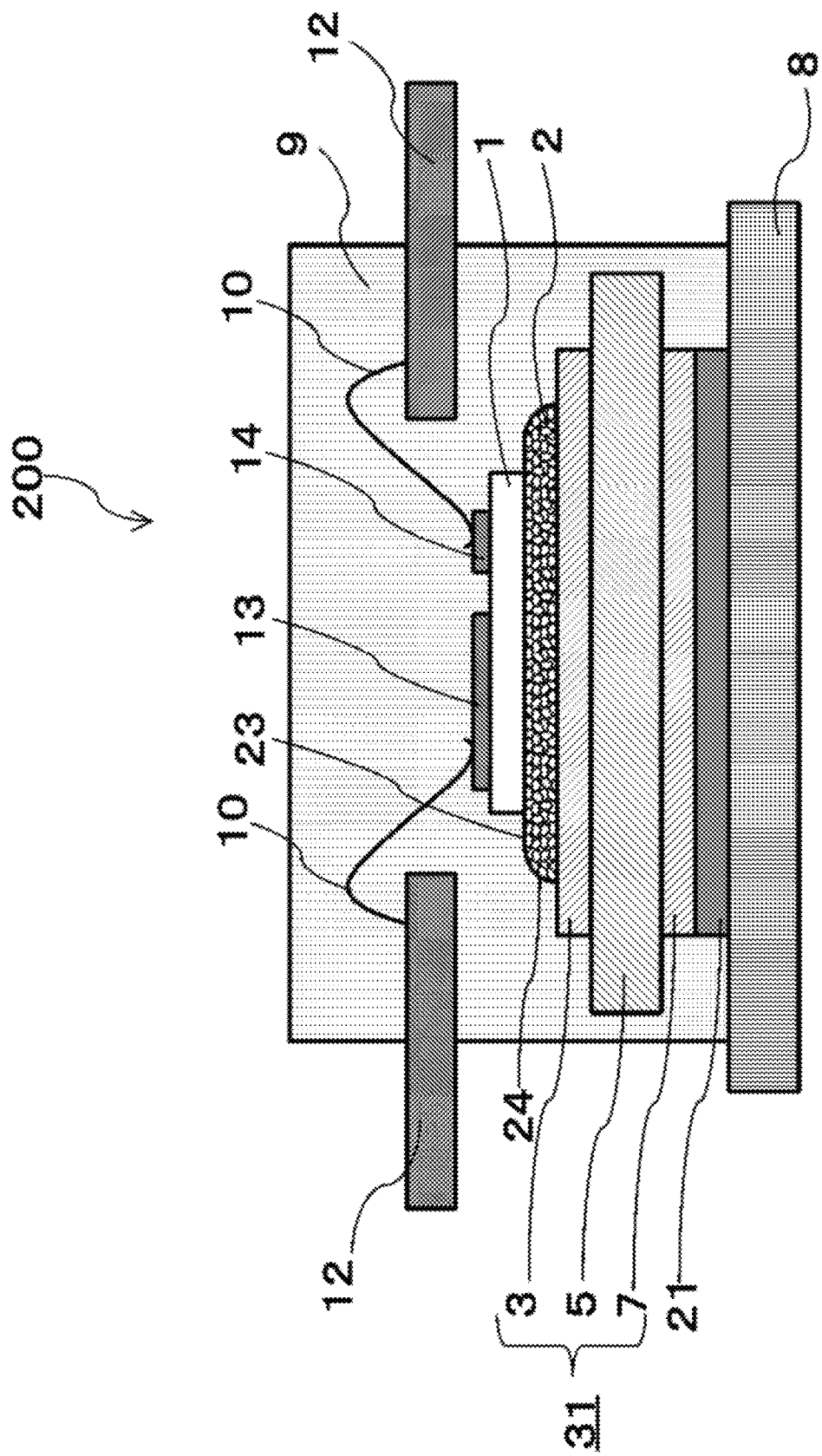
FIG. 6 is a schematic diagram of a cross-sectional structure showing another power module according to Embodiment 1.

FIG. 6 is a schematic diagram of a cross-sectional structure showing another power module according to Embodiment 1. As shown in the figure, a power module 200 includes the semiconductor device 1, the sintering joining member 2, an insulating substrate 31, the base plate 8, the sealing member 9, the bonding wires 10, the lead terminals 12, and an insulating substrate's bottom joining member 21, which is a joining layer.

The insulating substrate 11 of the power module 100 shown in FIG. 1 and FIG. 2 has a configuration in which the first circuit layer 3, the second circuit layer 4, the first metal layer 7, the second metal layer 6, and the insulating layer (ceramic substrate) 5 are included. On the other hand, in the power module 200 shown in FIG. 6, the configuration is such that the first circuit layer 3, which is a circuit layer, and the first metal layer 7, which is a metal layer, are directly joined to the insulating layer 5 without having the second circuit layer 4 and the second metal layer 6.

Furthermore, in the power module 200, the insulating substrate 31 and the base plate 8 are joined together using the insulating substrate's bottom joining member 21. A lead (Pb)-free solder or a lead-containing solder can be used for the insulating substrate's bottom joining member 21. As is the case with the sintering joining member 2, the raw materials of the insulating substrate's bottom joining member 21 include, for example, a sinter paste material such as an Ag nanoparticle paste, a Cu nanoparticle paste, and the same pastes whose particles include microparticles. As shown in FIG. 1, the joining may be performed not using the insulating substrate's bottom joining member 21 but using the direct joining method or the active metal joining method. In this configuration, the first circuit layer only is the circuit layer.

The elastic moduli of the members of the power modules 100 and 200, each having their respective configurations described above, are increased in the following order: the semiconductor device 1; the structure (board) in which the base plate 8 and the insulating substrate 11 or 31 are joined together; the bonding wires 10; and the sintering joining member 2.

As described above, the sintering joining member 2 is made larger than the back surface of the semiconductor device 1 in outer circumference to provide the flat portion 23 that sticks out of the outer circumference of the back surface of the semiconductor device 1. By using this flat portion 23 of the sintering joining member 2, the heat generated in the semiconductor device 1 is dissipated. This improves the heat dissipation from the semiconductor device 1 and, as a result, enhances the reliability of the power modules 100 and 200.

The semiconductor device 1 and the insulating substrate 11 or 31 are joined together by using the sintering joining member 2, which is larger than the back surface of the semiconductor device 1 in outer circumference. As a result, the edge of the semiconductor device 1 is arranged away from the edge of the sintering joining member 2. Therefore, there is no stress concentration at the edge of the sintering joining member 2, and thus a crack is prevented from extending from the edge of the sintering joining member 2 into the sintering joining member 2.

In addition, the semiconductor device 1 is joined to the insulating substrate 11 using the sintering joining member 2, which is very soft in comparison to the joints between the other members. This protects the semiconductor device 1, which is joined using the soft sintering joining member 2 to the structure (substrate) formed by joining the hard insulating substrate 11 and the hard base plate 8 together, from being damaged and also prolongs the life of the bonding of the bonding wires 10 in their bonding portions.

Moreover, the sintering joining member 2 has voids also on its surface. These voids create the anchor effect, which in turn improves the adhesion between the surface of the sintering joining member 2 and the sealing member 9. This prevents the sealing member 9 from peeling off.

Next, the manufacturing method of the power module 100 according to Embodiment 1, configured as described above, will be described.

First, the base plate 8, which serve as a bottom unit of the power module 100, is prepared (Base plate preparation step).

Next, the insulating substrate 11 with the first circuit layer 3 and the second circuit layer 4 provided on the upper surface of the insulating layer 5 and with the first metal layer 7 and the second metal layer 6 provided on the lower surface of the insulating layer 5 is prepared (Insulating substrate preparation step). Brazing or the like is used for joining the first circuit layer 3 and the second circuit layer 4 to the insulating layer 5, and for joining the first metal layer 7 and the second metal layer 6 to the insulating layer 5.

Next, the semiconductor device 1 is joined to the upper surface of the first circuit layer 3 on the upper-surface side of the insulating substrate 11 using the sintering joining member 2 (Semiconductor device joining step). The sintering joining member 2 is formed firstly by being pasted to the upper surface of the first circuit layer 3 using a printing method or a method using a dispenser, and then by being sintered at a heating temperature of the same level as the temperature used for the conventional Sn-based solder material, though the heating temperature varies depending on the diameters of the particles used. The sintering joining member 2 is pasted so as to be larger than the semiconductor device 1. The semiconductor device 1 is joined to the first circuit layer 3 after being mounted on the upper surface of the sintering joining member 2. The sintering joining member 2 pasted to the upper surface of the first circuit layer 3 has a thickness of about 40 μm by the sintering treatment. After the semiconductor device 1 is joined to the upper surface of the first circuit layer 3 provided on the upper-surface side of the insulating substrate 11, the upper surface of the base plate 8 and the lower surface of the first metal layer 7 provided on the lower-surface side of the insulating layer 5 are joined together using the direct joining method or the active metal joining method (Insulating substrate joining step). Thus, the base plate 8 and the insulating substrate 11 are joined together.

After the semiconductor device 1 is placed on the upper surface of the first circuit layer 3 provided on the upper-surface side of the insulating substrate 11, the main electrode 13 and the control signal electrodes 14, which are the surface electrodes of the semiconductor device 1, and the lead terminals 12, which are the terminal members, are electrically connected using the bonding wires 10, which are the wiring members (Member wiring formation step).

After the wiring is formed using the bonding wires 10, the semiconductor device 1, the insulating substrate 11, and the bonding wires 10 are sealed using the sealing member 9. At this time, the lead terminals 12 are sealed by the sealing member 9 with one end of each lead terminal 12 held inside the sealing member 9 and the other end thereof exposed from the side of the sealing member 9 (Sealing step).

These are the main manufacturing steps, through which the power module 100, shown in FIG. 1, is manufactured. The power module 200 also can be manufactured by replacing the configuration of the insulating substrate 11 with the configuration of the insulating substrate 31 to form the circuit layer and the metal layer.

In the power modules 100 and 200, which are configured as described above, the sintering joining member 2 is made larger than the back surface of the semiconductor device 1 in outer circumference to provide the flat portion 23 that sticks out of the outer circumference of the back surface of the semiconductor device 1. Therefore, the heat generated in the semiconductor device 1 is spread over the flat portion 23 of the sintering joining member 2 to be dissipated therefrom. This improves the heat dissipation from the semiconductor device 1 and, as a result, enhances the reliability of the power modules 100 and 200.

The semiconductor device 1 and the insulating substrate 11 or 31 are joined together by using the sintering joining member 2, which is larger than the back surface of the semiconductor device 1 in outer circumference. As a result, the edge of the semiconductor device 1 is arranged away from the edge of the sintering joining member 2. Therefore, there is no stress concentration at the edge of the sintering joining member 2, and thus a crack is prevented from extending from the edge of the sintering joining member 2 into the sintering joining member 2.

In addition, the semiconductor device 1 is joined to the insulating substrate 11 using the sintering joining member 2, which is very soft in comparison to the joints between the other members. This protects the semiconductor device 1, which is joined using the soft sintering joining member 2 to the structure (substrate) formed by joining the hard insulating substrate 11 and the hard base plate 8 together, from being damaged and also prolongs the life of the bonding of the bonding wires 10 in their bonding portions.

Moreover, the sintering joining member 2 has voids on its surface. These voids create the anchor effect, which in turn improves the adhesion between the surface of the sintering joining member 2 and the sealing member 9. This prevents the sealing member 9 from peeling off.

Embodiment 2

Embodiment 2 is different from Embodiment 1 in that the plurality of semiconductor devices 1 are provided on the upper surface of the sintering joining member 2. As described earlier, the plurality of semiconductor devices 1 are placed on the same upper surface of the sintering joining member 2, which is larger than the entire placement area of the semiconductor devices 1 and has the flat portion 23 sticking out of the placement area. Therefore, the heat generated in the semiconductor devices 1 is spread over the flat portion 23 of the sintering joining member 2 to be dissipated therefrom. This improves the heat dissipation from the semiconductor devices 1 and, as a result, enhances the reliability of a power module 300. The other features are the same as in the Embodiment 1, so that the detailed descriptions are omitted.

Figure 7:
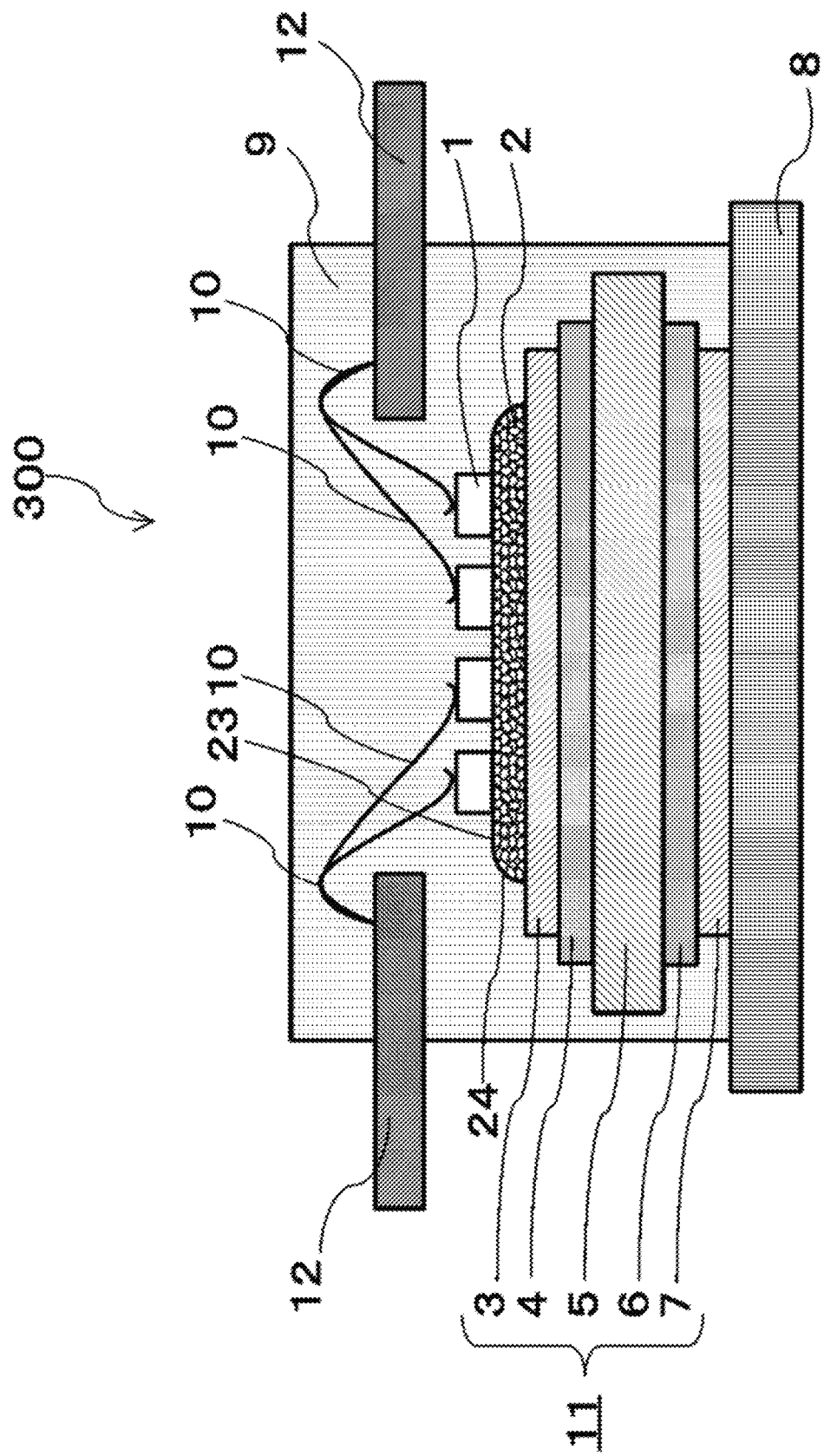
FIG. 7 is a schematic diagram of a cross-sectional structure showing a power module according to Embodiment 2.
Figure 8:
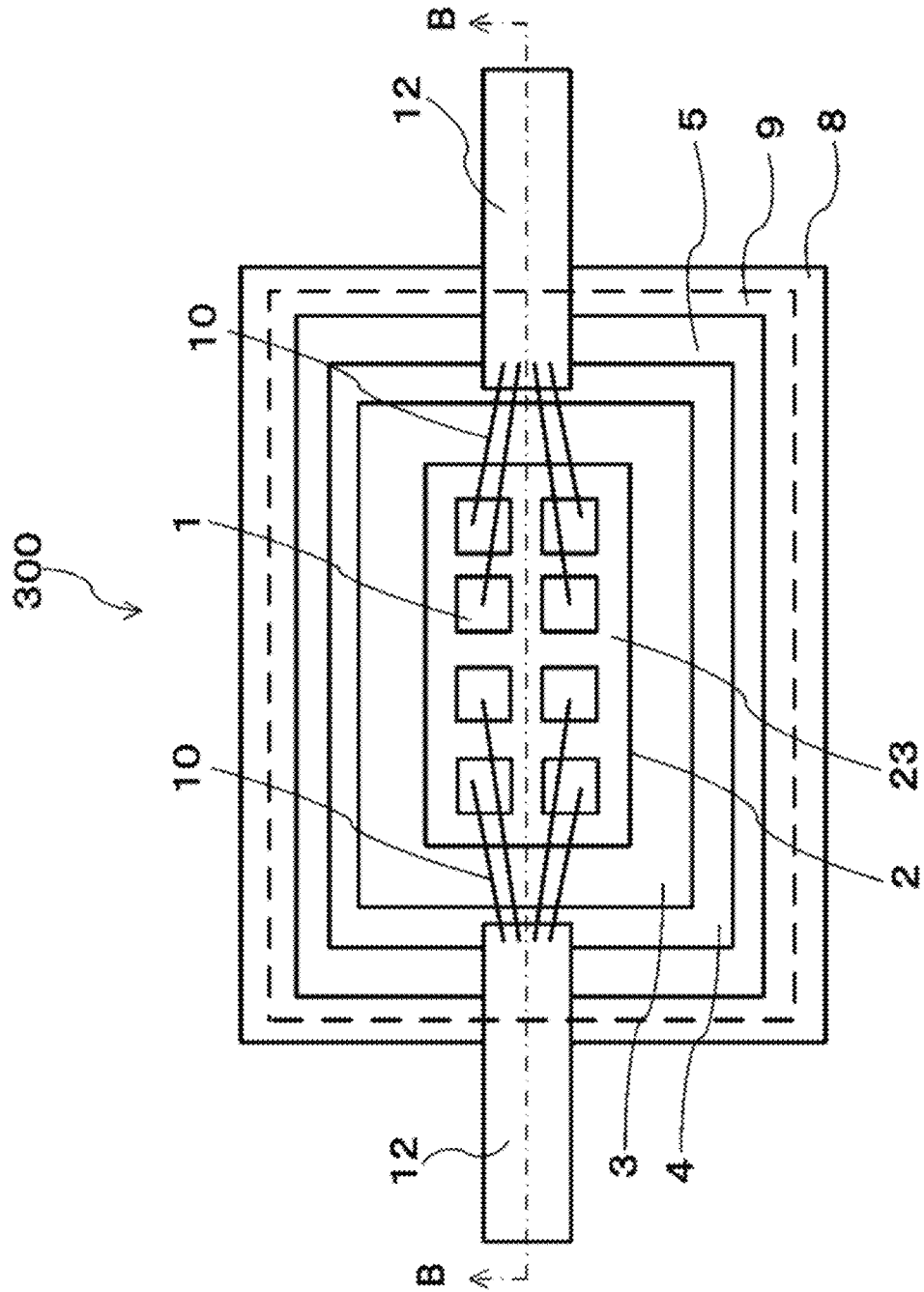
FIG. 8 is a schematic diagram of a planar structure showing the power module according to Embodiment 2.

FIG. 7 is a schematic diagram of a cross-sectional structure showing a power module according to Embodiment 2. FIG. 8 is a schematic diagram of a planar structure showing the power module according to Embodiment 2. FIG. 7 is a schematic diagram of a cross-sectional structure of the power module along the single-dotted line BB in FIG. 8. FIG. 8 is a schematic diagram of a planar structure of the power module 300 viewed from above through a sealing member 9.

As shown in the figure, the power module 300 includes the plurality of semiconductor devices 1, the sintering joining member 2, the insulating substrate 11, the base plate 8, the sealing member 9, the bonding wires 10, and the lead terminals 12.

In Embodiment 1, one sintering joining member 2 is provided for one semiconductor device 1, regardless of whether there is one semiconductor device 1 or there are more of them. In contrast, in Embodiment 2, the semiconductor devices 1 are joined to the upper surface of the first circuit layer 3 of the insulating substrate 11 using one sintering joining member 2 that is larger than the entire joining area of the semiconductor devices 1. The upper surface of the sintering joining member 2 is exposed between the semiconductor devices 1. Thus, the sealing member 9 can directly contact the upper surface of the sintering joining member 2 having voids thereon via the spaces between the semiconductor devices 1. This enhances the adhesion of the sealing member 9 to the sintering joining member 2 and prevents the sealing member 9 from peeling off.

As shown in FIG. 7 and FIG. 8, when the plurality of semiconductor devices 1 are joined to the upper surface of the first circuit layer 3 via the sintering joining member 2, the width (length) of the flat portion 23, sticking out of the outer circumference surrounding the back surfaces of the semiconductor devices 1, may be determined within a range substantially from 1 to 2 mm according to the rating of the power module to be applied. The semiconductor devices 1 need to be separated from each other by a distance as wide as the width (length) of the flat portion 23 of the sintering joining member 2. For example, as shown in FIG. 8 viewed from above (planer view), in a case where a total of 8 semiconductor devices 1 each with a 20 mm square size are placed on the upper surface of the sintering joining member 2, two vertically and four horizontally, the sintering joining member 2 needs to have a size of about 46 mm in length and 90 mm in width. This allows the plurality of semiconductor devices 1 to be arranged thereon while ensuring insulation between them.

Thus, even in a case where the plurality of semiconductor devices 1 are used, the heat generated by the semiconductor devices 1 is spread out and dissipated by making the upper surface of the sintering joining member 2 larger than the entire joining area of the semiconductor devices. This improves the heat dissipation of the power module 300 and, as a result, enhances its reliability.

In addition, the semiconductor devices 1 are joined using one sintering joining member 2, so that the edge of the sintering joining member 2 is displaced from the edges of the semiconductor devices 1. This reduces the stress concentration on the sintering joining member 2 that contacts the edges of the semiconductor devices 1, and thus prevents the sintering joining member 2 from cracking.

In the power module 300, which is configured as described above, the sintering joining member 2 is made larger than the entire joining area of the semiconductor devices 1 in outer circumference to provide the flat portion 23 that sticks out of the outer circumference surrounding the back surfaces of the semiconductor devices 1. Therefore, the heat generated in the semiconductor devices 1 is spread over the flat portion 23 of the sintering joining member 2 to be dissipated therefrom. This improves the heat dissipation from the semiconductor devices 1 and, as a result, enhances the reliability of the power module 300.

The semiconductor devices 1 are joined to the insulating substrate 11 using the sintering joining member 2 that is larger in outer circumference than the entire joining area of the semiconductor devices 1. As a result, the edges of the semiconductor devices 1 are arranged away from the edge of the sintering joining member 2. Therefore, there is no stress concentration at the edge of the sintering joining member 2, and thus a crack is prevented from extending from the edge of the sintering joining member 2 into the sintering joining member 2.

In addition, the semiconductor devices 1 are joined to the insulating substrate 11 using the sintering joining member 2, which is very soft in comparison to the joints between the other members. This protects the semiconductor devices 1, which are joined using the soft sintering joining member 2 to the structure (substrate) formed by joining the hard insulating substrate 11 and the hard base plate 8 together, from being damaged and also prolongs the life of the bonding of the bonding wires 10 in their bonding portions.

Moreover, the sintering joining member 2 has voids on its surface. These voids create the anchor effect, which in turn improves the adhesion between the surface of the sintering joining member 2 and the sealing member 9. This prevents the sealing member 9 from peeling off.

Embodiment 3

Embodiment 3 is different from Embodiments 1 and 2 in that the bonding wires 10 and the lead terminals 12 are replaced by a main terminal joining layer 16 and a main terminal 15, respectively. The main terminal 15 used here is a plate-shaped metal member. As described earlier, also in the case where the electrodes formed on the upper surfaces of the semiconductor devices 1 are connected to the outside using the main terminal joining layer 16 and the main terminal 15, the semiconductor devices 1 are placed on the upper surface of the sintering joining member 2, which is larger than the entire placement area of the semiconductor devices 1 and has the flat portion 23 sticking out of the placement area. Therefore, the heat generated in the semiconductor devices 1 is spread over the flat portion 23 of the sintering joining member 2 to be dissipated therefrom. This improves the heat dissipation from the semiconductor devices 1 and, as a result, enhances the reliability of a power module 400. The other features are the same as in the Embodiments 1 and 2, so that the detailed descriptions are omitted.

Figure 9:
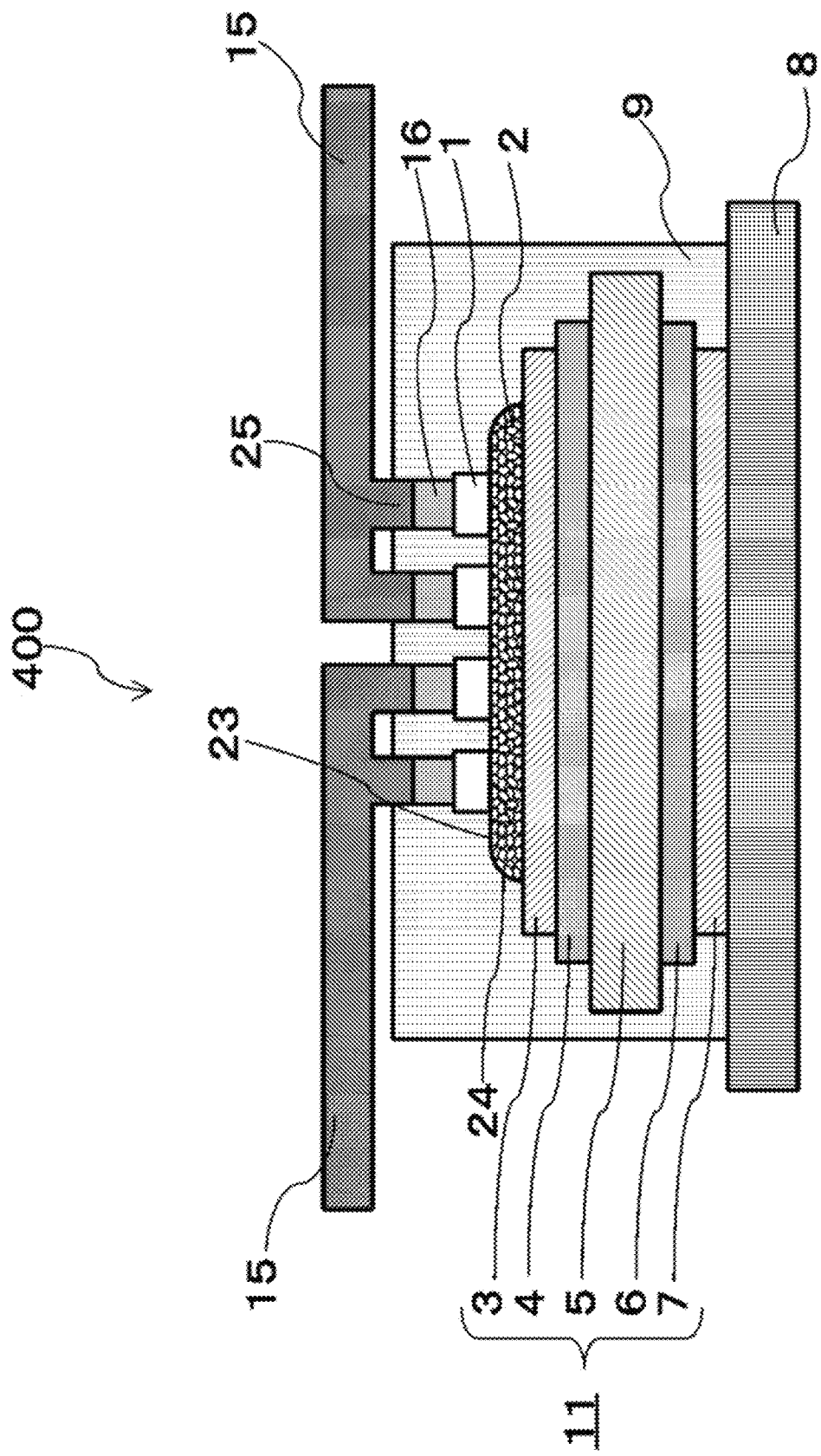
FIG. 9 is a schematic diagram of a cross-sectional structure showing a power module according to Embodiment 3.

FIG. 9 is a schematic diagram of a cross-sectional structure showing the power module according to Embodiment 3.

As shown in the figure, the power module 400 includes the plurality of semiconductor devices 1, the sintering joining member 2, the insulating substrate 11, the base plate 8, the sealing member 9, the main terminal 15, which is a plate-shaped metal member, and the main terminal joining layer 16.

As shown in FIG. 9, in Embodiment 3, the connection method for connecting the electrodes of the semiconductor devices 1 and the outside is changed from the method using the bonding wires 10 and the lead terminals 12 to a method called Direct Lead Bonding (DLB) using the main terminal joining layer 16 formed on the main electrodes of the semiconductor devices 1 and the main terminal 15. As shown in FIG. 9, the main terminal 15 is joined to the main electrodes (not shown) of the semiconductor devices 1 via the main terminal joining layer 16. The main terminal 15, which has protrusions 25 at the portions to be joined to the main terminal joining layer 16, is positioned outside of the sealing member 9. The protrusions 25 may protrude toward the electrodes of the upper surfaces of the semiconductor devices 1 from the lower surface of the main terminal 15 or from the side surface thereof.

The material of the main terminal 15 should be a material with good electrical conductivity. The examples include, but not limited to, an alloy containing a main component of copper (Cu) or aluminum (Al) and a composite material that brings the linear expansion coefficient closer to the semiconductor devices 1. In FIG. 9, although not shown, the DLB structure may be used for connecting control signal terminals, but the bonding wires 10 may also be used because the control signal terminals only pass a very limited amount of current compared to the main terminal 15. Some of the semiconductor devices 1 may not have the control signal terminals.

The raw materials of the main terminal joining layer 16 include, for example, a sinter paste material such as an Ag nanoparticle paste, a Cu nanoparticle paste, and the same pastes whose particles include microparticles. A high-temperature solder containing lead (Pb) and tin (Sn), a lead-free solder, or the like can also be used. As a further example, a conductive adhesive material containing Ag or Cu particles and epoxy resin can be used as the material for the main terminal joining layer 16. The materials to be used for the main terminal joining layer 16, however, are not limited to these.

The materials exemplified above can also be used in a configuration where the main terminal 15 does not have the protrusions 25 and is joined to the main terminal joining layer 16 inside the sealing member 9. Alternatively, a portion of the main terminal 15 including the protrusions 25 may be placed and sealed inside the sealing member 9. In this case, the end of the main terminal 15 provided with the protrusions 25 is contained inside the sealing member 9. The other end of the main terminal 15 opposite to the portion provided with the protrusions 25 is exposed (sticking out) from the side of the sealing member 9 to be outside of the sealing.

As described earlier, the semiconductor devices 1 are placed on the upper surface of the sintering joining member 2, which is larger than the entire placement area of the semiconductor devices 1 and has the flat portion 23 sticking out of the placement area. The thickness of the sintering joining member 2 is the same at any position where a semiconductor device 1 is placed. Therefore, the heights of the upper surfaces of the semiconductor devices 1 are made flush. This makes it possible to connect, easily and simultaneously, the main terminal 15 having the DLB structure to the main electrodes 13 of the semiconductor devices 1.

Figure 10:
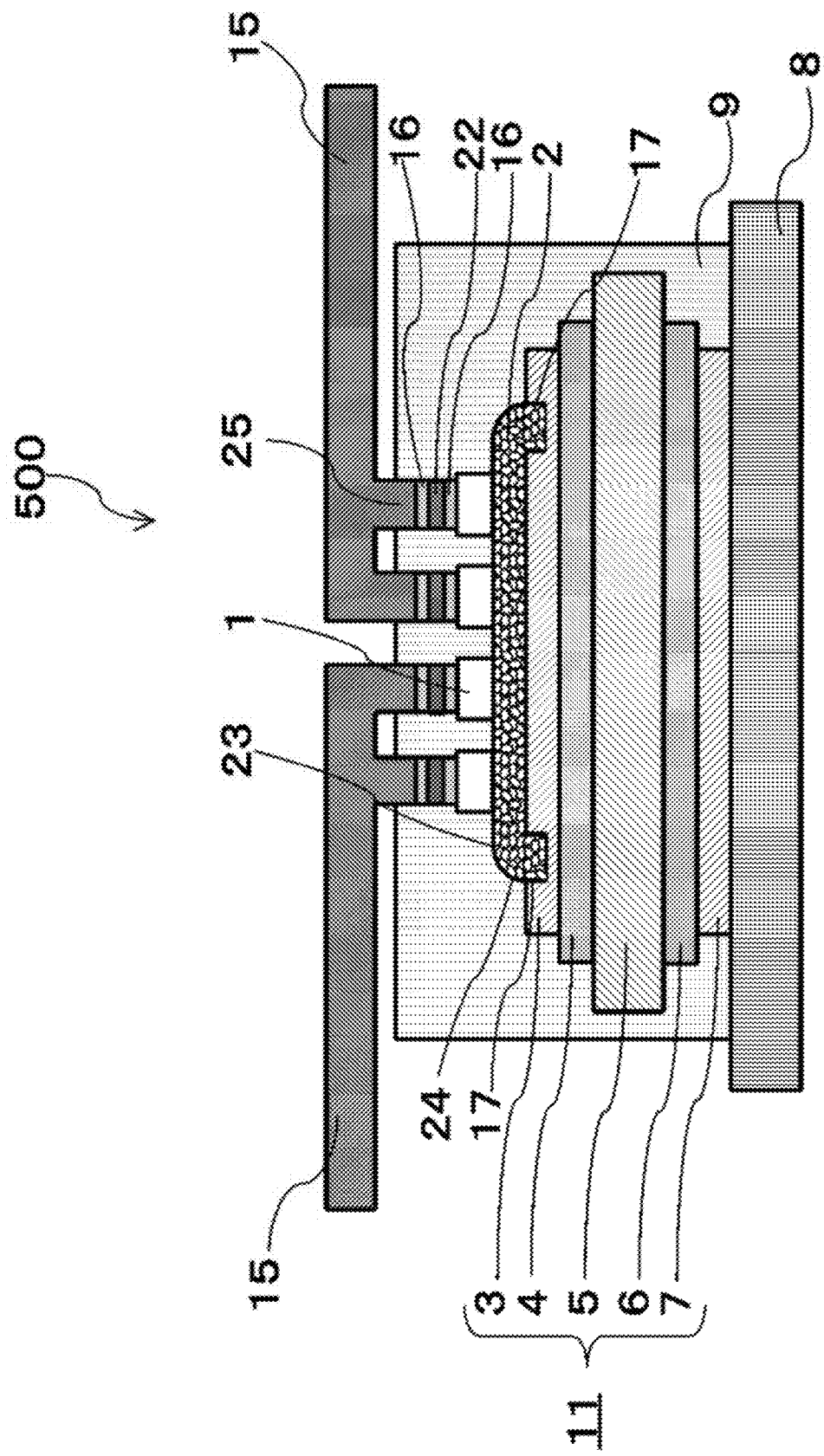
FIG. 10 is a schematic diagram of a cross-sectional structure showing another power module according to Embodiment 3.

FIG. 10 is a schematic diagram of a cross-sectional structure showing another power module according to Embodiment 3. As shown in the figure, a power module 500 includes the plurality of semiconductor devices 1, the sintering joining member 2, the insulating substrate 11, the base plate 8, the sealing member 9, the main terminal 15, which is a plate-shaped metal member, the main terminal joining layer 16, a stress buffer layer 22, and a depression (recess) 17 formed on the upper surface of the first circuit layer 3.

As shown in FIG. 10, the DLB structure is used as the connection structure with the outside as in FIG. 9. However, the electrodes of the semiconductor devices 1 and the outside may be connected using the bonding wires as the connection means. The depression 17 of the first circuit layer is formed on the upper surface portion of the first circuit layer 3 facing the edge portion of the sintering joining member 2. The depression 17 of the first circuit layer 3 takes in part of the sintering joining member 2 and is therewith filled. The sintering joining member 2 filling the inside of the depression 17 of the first circuit layer 3 contributes to the increase in thickness of the edge portion of the sintering joining member 2.

In FIG. 10, in order to harmonize the linear expansion coefficients of the semiconductor devices 1 and the main terminal 15, the semiconductor devices 1 and the main terminal 15 are joined together with the stress buffer layer 22 placed therebetween, the stress buffer layer 22 having a main terminal joining layer 16 on its top and bottom. If there is no significant difference in the linear expansion coefficients between the semiconductor devices 1 and the main terminal 15, the semiconductor devices 1 and the main terminal 15 may be joined using the main terminal joining layer 16 without the stress buffer layer 22 as in FIG. 9.

As described above, the depression 17 provided on the upper surface portion of the first circuit layer 3 facing the edge portion of the sintering joining member 2 increases the thickness of the edge of the sintering joining member 2 and thereby reduces the stress applied thereto. This prevents the sintering joining member 2 from peeling off or cracking.

Figure 11:
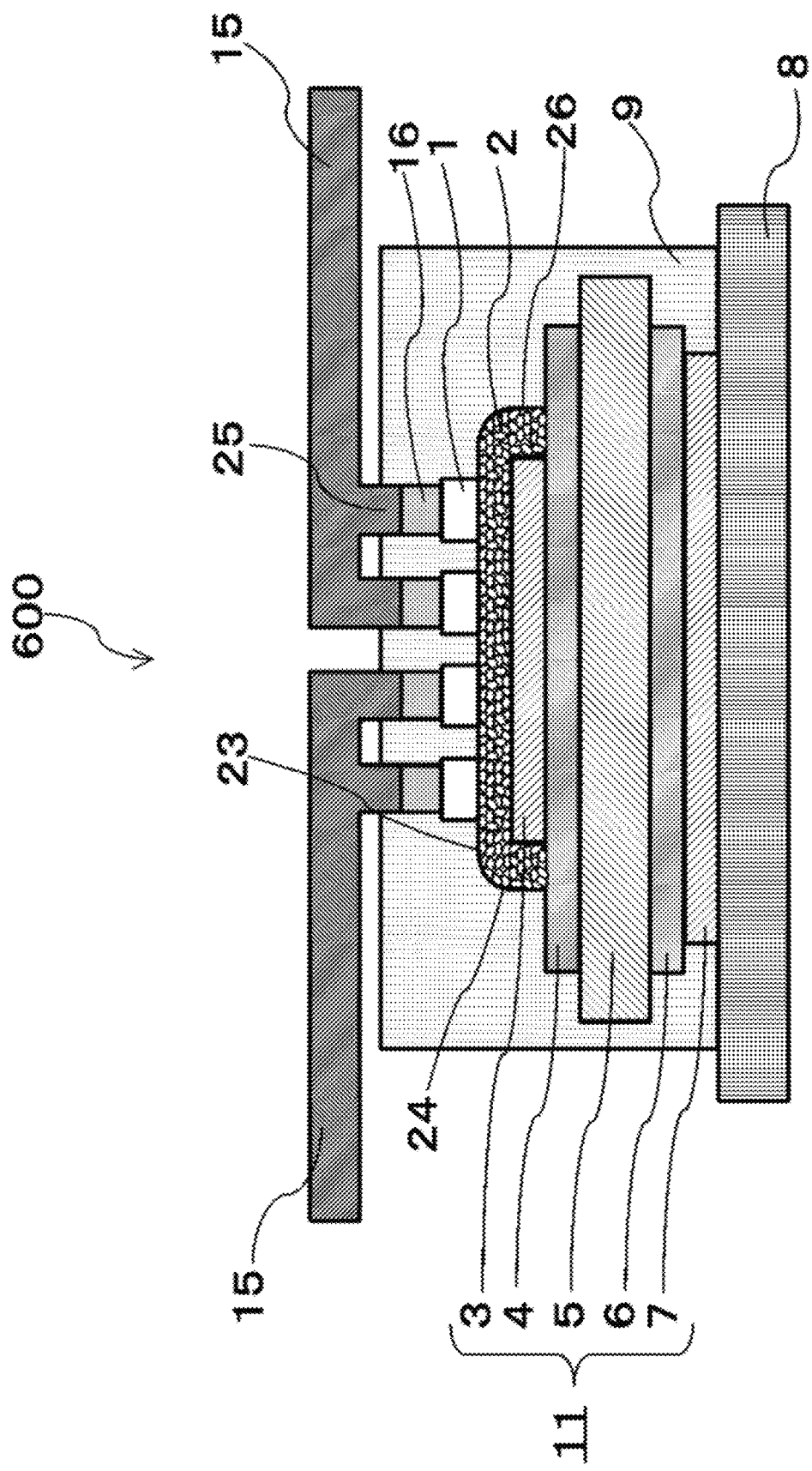
FIG. 11 is a schematic diagram of a cross-sectional structure showing another power module according to Embodiment 3.

FIG. 11 is a schematic diagram of a cross-sectional structure showing another power module according to Embodiment 3. As shown in the figure, the power module 600 includes the plurality of semiconductor devices 1, the sintering joining member 2, the insulating substrate 11, the base plate 8, the sealing member 9, the main terminal 15, which is a plate-shaped metal member, the main terminal joining layer 16, a protruding portion 26 of the sintering joining member 2 formed on the side surface of the first circuit layer 3.

The sintering joining member 2 in FIG. 11 is different from the sintering joining member 2 in FIG. 9 in that the sintering joining member 2 covers the upper and side surfaces of the first circuit layer 3 by being extended also over the side face of the first circuit layer 3. The protruding portion 26 of the sintering joining member 2 is in contact with the side surface of the first circuit layer 3 and the upper surface of the second circuit layer 4. Although the figure shows a case where the plurality of semiconductor devices 1 are joined to the sintering joining member 2, a similar configuration can be used even in a case where a single semiconductor device 1 is used or in a case where the second circuit layer or the second metal layer is not used. When the second circuit layer 4 is not used, the protruding portion 26 of the sintering joining member 2 contacts the upper surface of the insulating layer 5. Since the sintering joining member 2 is also formed on the side surface of the first circuit layer 3, the width, in other words, the outer circumference, of the first circuit layer 3 is set smaller than the width, in other words, the outer circumference, of the first metal layer 7.

As described above, the sintering joining member 2 covers the entire exposed surface of the first circuit layer 3 including the upper and side surfaces, and the voids are formed also on the surface of the sintering joining member 2 in contact with the sealing member 9. Therefore, the voids formed on the surface of the sintering joining member 2 create the anchor effect without the need to roughen the surface of the first circuit layer 3 to form irregularities. This improves the adhesion between the sintering joining member 2 and the sealing member 9.

In each of the power modules 400, 500 and 600, which is configured as described above, the sintering joining member 2 is made larger than the entire joining area of the semiconductor devices 1 in outer circumference to provide the flat portion 23 that sticks out of the outer circumference surrounding the back surfaces of the semiconductor devices 1. Therefore, the heat generated in the semiconductor devices 1 is spread over the flat portion 23 of the sintering joining member 2 to be dissipated therefrom. This improves the heat dissipation from the semiconductor devices 1 and, as a result, enhances the reliability of the power modules 400, 500 and 600.

The semiconductor devices 1 are joined to the insulating substrate 11 using the sintering joining member 2 that is larger in outer circumference than the entire joining area of the semiconductor devices 1. As a result, the edges of the semiconductor devices 1 are arranged away from the edge of the sintering joining member 2. Therefore, there is no stress concentration at the edge of the sintering joining member 2, and thus a crack is prevented from extending from the edge of the sintering joining member 2 into the sintering joining member 2.

In addition, the semiconductor devices 1 are joined to the insulating substrate 11 using the sintering joining member 2, which is very soft in comparison to the joints between the other members. This protects the semiconductor devices 1, which are joined using the soft sintering joining member 2 to the structure (substrate) formed by joining the hard insulating substrate 11 and the hard base plate 8 together, from being damaged and also prolongs the life of the bonding of the bonding wires 10 in their bonding portions.

Moreover, the sintering joining member 2 has voids on its surface. These voids create the anchor effect, which in turn improves the adhesion between the surface of the sintering joining member 2 and the sealing member 9. This prevents the sealing member 9 from peeling off.

In addition, the depression 17 provided on the upper surface portion of the first circuit layer 3 facing the edge portion of the sintering joining member 2 increases the thickness of the edge of the sintering joining member 2 and thereby reduces the stress applied thereto. This prevents the sintering joining member 2 from peeling off or cracking.

Furthermore, the sintering joining member 2 having the protruding portion 26 covers the entire exposed surface of the first circuit layer 3 including the upper and side surfaces, and the voids are formed also on the surface of the sintering joining member 2 in contact with the sealing member 9. The anchor effect thereby created improves the adhesion between the sintering joining member 2 and the sealing member 9 without the need to roughen the surface of the first circuit layer 3 to form irregularities.

Embodiment 4

In Embodiment 4, the power module according to any one of Embodiments 1 to 3 described above is applied to a power conversion device. Application of this disclosure is not limited to a specific type of power conversion device. However, in Embodiment 4, an example in which this disclosure is applied to a three-phase inverter will be described.

Figure 12:
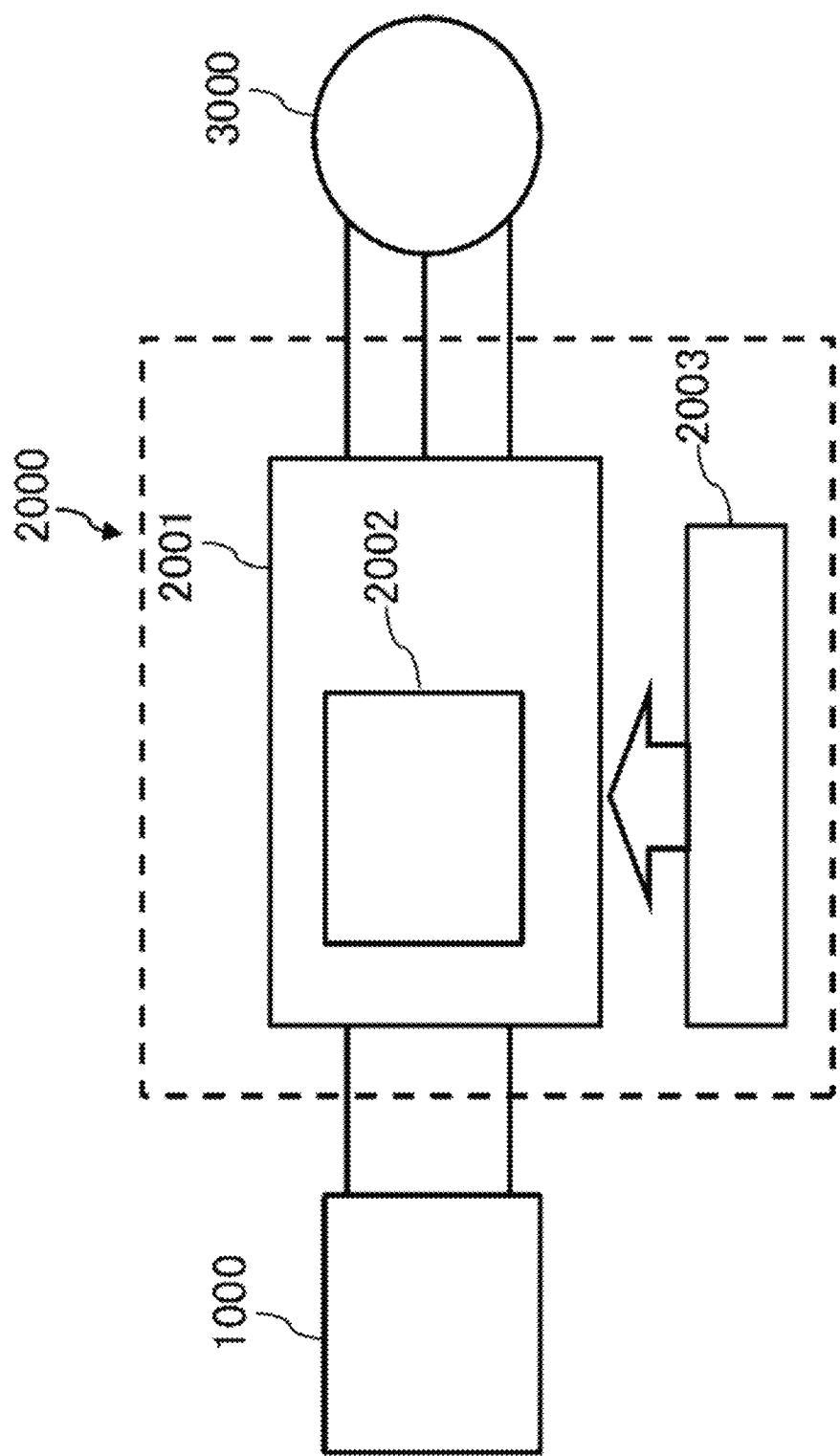
FIG. 12 is a block diagram showing a configuration of a power conversion system to which a power conversion device according to Embodiment 4 is applied.

FIG. 12 is a block diagram showing a configuration of a power conversion system to which the power conversion device according to Embodiment 4 is applied.

The power conversion system, shown in FIG. 12, includes a power supply 1000, a power conversion device 2000, and a load 3000. The power supply 1000, which is a DC power supply, supplies DC power to the power conversion device 2000. For the power supply 1000, various devices and systems, such as a DC system, a solar cell, a storage battery, a rectifier circuit connected to an AC system, an AC/DC converter, can be used. Furthermore, a DC/DC converter that converts DC power outputted from the DC system to a predetermined power may be used for the power supply 1000.

The power conversion device 2000, which is a three-phase inverter connected between the power supply 1000 and the load 3000, converts the DC power supplied from the power supply 1000 to AC power, and supplies the AC power to the load 3000. As shown in FIG. 12, the power conversion device 2000 includes a main conversion circuit 2001, which converts the DC power inputted from the power supply 1000 to AC power and outputs it, and a control circuit 2003, which outputs a control signal for controlling the main conversion circuit 2001 to it.

The load 3000 is a three-phase electric motor driven by the AC power supplied from the power conversion device 2000. Note that the load 3000 is an electric motor installed in various electrical equipment, not being limited to any specific application. For example, it is an electric motor used in a hybrid car, an electric car, a railroad car, an elevator, air conditioning equipment, etc.

The following is a detailed description of the power conversion device 2000. The main conversion circuit 2001 includes a switching device and a reflux diode, both (not shown) of which are built in the power module 2002. The main conversion circuit 2001 converts the DC power supplied from the power supply 1000 to AC power by the switching operation of the switching device and supplies the AC power to the load 3000. The specific circuit configurations of the main conversion circuit 2001 are various. The main conversion circuit 2001 according to the present embodiment is a three-phase full-bridge circuit with two levels and includes six switching devices and six freewheeling diodes each connected in reverse parallel to one of the switching devices. The main conversion circuit 2001 is composed of the power module 2002 incorporating the switching devices, the freewheeling diodes, and other components, wherein the power module 2002 is one described in any one of Embodiments 1 to 3 explained above. The six switching devices are combined into pairs. In each pair, the switching devices are connected in series to form a pair of upper and lower arms. Each pair of the upper and lower arms constitutes a phase (U-phase, V-phase, or W-phase) of the full bridge circuit. The output terminals of the pairs of the upper and lower arms, in other words, the three output terminals of the main conversion circuit 2001, are connected to the load 3000.

The main conversion circuit 2001 includes a drive circuit (not shown) to drive the switching devices. The drive circuit may be built in the power module 2002 or may be separately provided. The drive circuit generates a drive signal to drive the switching devices of the main conversion circuit 2001 and supplies it to the control electrodes of the switching devices of the main conversion circuit 2001. Specifically, the drive circuit outputs a drive signal to turn on a switching device and a drive signal to turn off a switching device to their control electrodes in accordance with the control signal from the control circuit 2003 to be described later. The drive signal to keep a switching device in an ON state is a voltage signal (ON signal) above the threshold voltage of the switching device. The drive signal to keep the switching device in an OFF state is a voltage signal (OFF signal) below the threshold voltage of the switching device.

The control circuit 2003 controls the switching devices of the main conversion circuit 2001 so that the load 3000 is supplied with the power it needs. Specifically, the control circuit 2003 calculates the time (ON time) when each of the switching devices of the main conversion circuit 2001 should be in an ON state on the basis of the power to be supplied to the load 3000. For example, PWM control, in which ON time of each switching device is modulated in accordance with the voltage to be outputted, can be applied to the control of the main conversion circuit 2001. A control command (control signal) is outputted to the drive circuit of the main conversion circuit 2001 in a timely manner so that an ON signal is outputted to the switching device that should be in an ON state and an OFF signal is outputted to the switching device that should be in an OFF state. The drive circuit outputs the ON signal or the OFF signal to the control electrode of each of the switching devices as a drive signal in accordance with this control signal.

The power modules of Embodiments 1 to 3 improve the reliability of the power conversion device according to Embodiment 4 when they are used as the power module 2002 of the main conversion circuit 2001 configured as described above.

In the present embodiment, an example is described, in which this disclosure is applied to a three-phase inverter with two levels. However, this disclosure is not limited as such and can be applied to various power conversion devices. In the present embodiment, a power conversion device with two levels is used for description. However, this disclosure can also be applied to a multi-level power conversion device with three or more levels and even to a single-phase inverter if the load is single-phased. This disclosure can also be applied to a DC/DC converter, an AC/DC converter, and the like when supplying power to a DC load or the like.

Not limited to application to an electric motor as the load as described above, the power conversion device according to this disclosure can be used, for example, as a power supply system of an electric discharge machine, a laser processing machine, an induction heating cooker, and a non-contact power supply, and also as a power conditioner of a photovoltaic power generation system and a power storage system.

Note that if the semiconductor device 1 is a SiC device, it is to be operated at a higher temperature than a temperature at which a Si semiconductor is operated in order to take advantage of the SiC features. For power modules with a SiC device that requires higher reliability, this disclosure, which can provide the power modules with higher reliability, will be more beneficial.

The embodiments described above are in all respects illustrative and not limiting. The scope of this disclosure is indicated by the scope of CLAIMS, not by the scope of the embodiments described above, and includes all modifications made within the meaning and scope equivalent to those of CLAIMS. The components disclosed in the above embodiments may be combined, as necessary.

DESCRIPTION OF THE SYMBOLS

1 semiconductor device,
2 sintering joining member,
3 first circuit layer,
4 second circuit layer,
5 insulating layer (ceramic substrate),
6 second metal layer,
7 first metal layer,
8 base plate,
9 sealing member,
10 bonding wire,
11, 31 insulating substrate,
12 lead terminal,
13 main electrode,
14 control signal electrode,
15 main terminal,
16 main terminal joining layer,
17 depression of first circuit layer,
18 recess of sintering joining member,
20 slope (taper) angle,
21 insulating substrate's bottom joining member,
22 stress buffer layer,
23 flat portion of sintering joining member,
24 side portion of sintering joining member,
25 protruding portion of main terminal,
26 protruding portion of sintering joining member,
100, 200, 300, 400, 500, 600, 2002 power module,
1000 power supply,
2000 power conversion device,
2001 main conversion circuit,
2003 control circuit,
3000 load

The invention claimed is:

1. A power module comprising:
at least one semiconductor device;
an insulating substrate having an insulating layer, a circuit layer provided on an upper surface of the insulating layer, and a metal layer provided on a lower surface of the insulating layer;
a sintering joining member with an upper surface larger in outer circumference than a back surface of the at least one semiconductor device to join together the back surface of the at least one semiconductor device and an upper surface of the circuit layer on an upper-surface side of the insulating layer;
a base plate joined to the lower surface of the insulating substrate; and
a wiring member joined to a front surface of the at least one semiconductor device, wherein
the elastic moduli of members are increased in the following order: the at least one semiconductor device; a structure in which the base plate and the insulating substrate are joined together; the wiring member; and the sintering joining member, and the upper surface of the circuit layer provided on the upper surface of the insulating substrate has a groove that is filled with the sintering joining member.

2. A power module comprising:
at least one semiconductor device;
an insulating substrate having an insulating layer, a circuit layer provided on an upper surface of the insulating layer, and a metal layer provided on a lower surface of the insulating layer; and
a sintering joining member with a flat upper surface larger in outer circumference than a unified back surface of the at least one semiconductor device to join together the back surface of the at least one semiconductor device and a flat upper surface of the circuit layer on an upper-surface side of the insulating layer, wherein
a plurality of semiconductor devices is provided as the at least one semiconductor device, the plurality of semiconductor devices is arranged at the same height from the circuit layer, and the plurality of semiconductor devices and a sealing resin that seals the plurality of semiconductor devices, the insulating substrate, and the sintering joining member together are provided on the flat upper surface of the one single sintering joining member, and
the upper surface of the circuit layer provided on the upper surface of the insulating substrate has a groove that is filled with the sintering joining member.

3. The power module according to claim 2, further comprising a base plate joined to the lower surface of the insulating substrate and a wiring member joined to a front surface of the at least one semiconductor device.

4. The power module according to claim 1, wherein the upper surface of the sintering joining member has a flat portion sticking out of the outer circumference of the at least one semiconductor device.

5. The power module according to claim 2, wherein the upper surface of the sintering joining member has a flat portion sticking out of the outer circumference of the at least one semiconductor device.

6. The power module according to claim 4, wherein the sintering joining member has a side portion in which a distance between an upper surface and a lower surface of the sintering joining member increases from outside to inside of the sintering joining member.

7. The power module according to claim 5, wherein the sintering joining member has a side portion in which a distance between an upper surface and a lower surface of the sintering joining member increases from outside to inside of the sintering joining member.

8. The power module according to claim 1, wherein the metal layer provided on the lower surface of the insulating layer and the base plate are directly joined together.

9. The power module according to claim 3, wherein the metal layer provided on the lower surface of the insulating layer and the base plate are directly joined together.

10. The power module according to claim 1, wherein the metal layer provided on the lower surface of the insulating layer and the base plate are joined together via a joining layer.

11. The power module according to claim 3, wherein the metal layer provided on the lower surface of the insulating layer and the base plate are joined together via a joining layer.

12. The power module according to claim 1, wherein the wiring member is a bonding wire or a plate-shaped metal member.

13. The power module according to claim 3, wherein the wiring member is a bonding wire or a plate-shaped metal member.

14. The power module according to claim 1, wherein thermal resistance of the sintering joining member is lower than those of the insulating layer, the circuit layer provided on the upper surface of the insulating layer, and the metal layer provided on the lower surface of the insulating layer.

15. The power module according to claim 1, wherein the sintering joining member contains metal particles of silver or copper.

16. The power module according to claim 1, wherein the sintering joining member is extended over a side face of the circuit layer provided on the upper surface of the insulating layer.

17. The power module according to claim 1, wherein the circuit layer has a first circuit layer and a second circuit layer, the metal layer has a first metal layer and a second metal layer, the first circuit layer is smaller in size than the second circuit layer, and the first metal layer is smaller in size than the second metal layer.

18. A power conversion device comprising:
the power module according to claim 1;
a main conversion circuit to convert inputted power and output the converted power; and
a control circuit to output a control signal for controlling the main conversion circuit to the main conversion circuit.

19. A power conversion device comprising:
the power module according to claim 2;
a main conversion circuit to convert inputted power and output the converted power; and
a control circuit to output a control signal for controlling the main conversion circuit to the main conversion circuit.

20. A power module comprising:
at least one semiconductor device;
an insulating substrate having an insulating layer, a circuit layer provided on an upper surface of the insulating layer, and a metal layer provided on a lower surface of the insulating layer;
a sintering joining member with an upper surface larger in outer circumference than a back surface of the at least one semiconductor device to join together the back surface of the at least one semiconductor device and an upper surface of the circuit layer on an upper-surface side of the insulating layer;
a base plate joined to the lower surface of the insulating substrate; and
a wiring member joined to a front surface of the at least one semiconductor device, wherein
the elastic moduli of members are increased in the following order: the at least one semiconductor device; a structure in which the base plate and the insulating substrate are joined together; the wiring member; and the sintering joining member, and
the circuit layer has a first circuit layer and a second circuit layer, the metal layer has a first metal layer and a second metal layer, the first circuit layer is smaller in size than the second circuit layer, and the first metal layer is smaller in size than the second metal layer.

21. A power module comprising:
at least one semiconductor device;

an insulating substrate having an insulating layer, a circuit layer provided on an upper surface of the insulating layer, and a metal layer provided on a lower surface of the insulating layer; and a sintering joining member with a flat upper surface larger in outer circumference than a unified back surface of the at least one semiconductor device to join together the back surface of the at least one semiconductor device and a flat upper surface of the circuit layer on an upper-surface side of the insulating layer, wherein a plurality of semiconductor devices is provided as the at least one semiconductor device, the plurality of semiconductor devices is arranged at the same height from the circuit layer, and the plurality of semiconductor devices and a sealing resin that seals the plurality of semiconductor devices, the insulating substrate, and the sintering joining member together are provided on the flat upper surface of the one single sintering joining member, and the circuit layer has a first circuit layer and a second circuit layer, the metal layer has a first metal layer and a second metal layer, the first circuit layer is smaller in size than the second circuit layer, and the first metal layer is smaller in size than the second metal layer.

\* \* \* \* \*